US009413092B2

(12) United States Patent
Chan et al.

(10) Patent No.: US 9,413,092 B2
(45) Date of Patent: Aug. 9, 2016

(54) ELECTRICAL POWER LINE CONNECTOR

(71) Applicant: Electric Power Research Institute, Inc., Palo Alto, CA (US)

(72) Inventors: John K. Chan, Pacifica, CA (US); Gary Charles Sibilant, Charlotte, NC (US); Jy-An Wang, Oak Ridge, TN (US); Fei Ren, Philadelphia, PA (US)

(73) Assignee: Electric Power Research Institute, Inc., Palo Alto, CA (US)

( * ) Notice: Subject to any disclaimer, the term of this patent is extended or adjusted under 35 U.S.C. 154(b) by 0 days.

(21) Appl. No.: 14/087,407

(22) Filed: Nov. 22, 2013

(65) Prior Publication Data

US 2014/0151117 A1 Jun. 5, 2014

Related U.S. Application Data

(60) Provisional application No. 61/731,563, filed on Nov. 30, 2012.

(51) Int. Cl.
*H01R 13/03* (2006.01)
*C23C 14/16* (2006.01)

(52) U.S. Cl.
CPC .............. *H01R 13/03* (2013.01); *C23C 14/16* (2013.01); *Y10T 29/49174* (2015.01)

(58) Field of Classification Search
CPC ................................ H01R 13/03; H01R 43/16
USPC ...................................................... 174/126.2
See application file for complete search history.

(56) References Cited

U.S. PATENT DOCUMENTS

| 3,647,933 | A | * | 3/1972 | Okada et al. ................. 174/43 |
|---|---|---|---|---|
| 4,784,707 | A | | 11/1988 | Wefers et al. |
| 5,098,485 | A | | 3/1992 | Evans |
| 6,096,391 | A | | 8/2000 | Muffoletto et al. |
| 6,180,869 | B1 | | 1/2001 | Meier et al. |
| 6,599,580 | B2 | | 7/2003 | Muffoletto et al. |
| 6,740,420 | B2 | | 5/2004 | Muffoletto et al. |
| 2002/0142653 | A1 | | 10/2002 | Hosaka et al. |

(Continued)

FOREIGN PATENT DOCUMENTS

| EP | 2 149 916 A2 | 2/2010 |
|---|---|---|
| EP | 2 149 917 A2 | 2/2010 |
| WO | WO 98/50944 | 11/1998 |

OTHER PUBLICATIONS

PCT/US2013/071487—International Search Report, Mar. 19, 2014.

(Continued)

*Primary Examiner* — Jeremy C Norris
*Assistant Examiner* — Muhammed Azam
(74) *Attorney, Agent, or Firm* — Curatolo Sidoti Co., LPA; Joseph G. Curatolo; Salvatore A. Sidoti

(57) ABSTRACT

An electrical connector for connecting electrical power transmission lines where the electrical connector is capable of conducting $1 \times 10^6$ to $2.5 \times 10^6$ siemens per meter squared ($S/m^2$), and includes a base metal having a surface layer doped with a conductive material dopant. The conductive dopant material improves the reliability and performance of the electrical connector. An electrical power transmission system includes electrical power transmission lines connected by the electrical connector, and a method of joining power transmission lines with the electrical connector.

20 Claims, 8 Drawing Sheets

(56) References Cited

U.S. PATENT DOCUMENTS

| | | |
|---|---|---|
| 2002/0192492 A1 | 12/2002 | Abys et al. |
| 2003/0113577 A1 | 6/2003 | Zheng |
| 2005/0189041 A1 | 9/2005 | Mantese et al. |
| 2005/0266261 A1 | 12/2005 | Muffoletto et al. |
| 2006/0013942 A1 | 1/2006 | Muffoletto et al. |
| 2006/0060858 A1 | 3/2006 | Park et al. |
| 2008/0044685 A1 | 2/2008 | Jin |
| 2008/0057799 A1 | 3/2008 | Pereira |
| 2009/0081909 A1* | 3/2009 | Goch ............... H01R 4/44 439/879 |
| 2010/0003864 A1* | 1/2010 | Fuzetti ............ H01R 4/5083 439/783 |
| 2010/0068841 A1 | 3/2010 | Park et al. |
| 2011/0003509 A1 | 1/2011 | Gailus |

OTHER PUBLICATIONS

PCT/US2013/071487—Written Opinion of the International Searching Authority, Mar. 19, 2014.

* cited by examiner

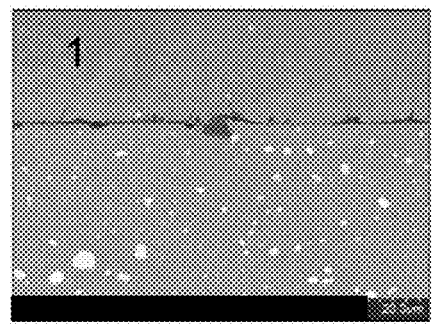
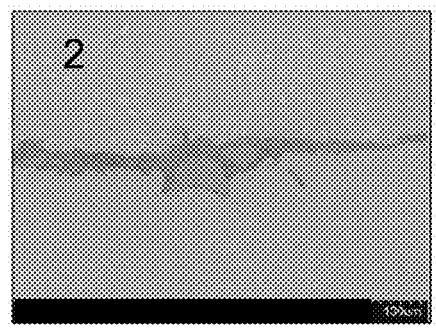
FIG. 1A          FIG. 1B
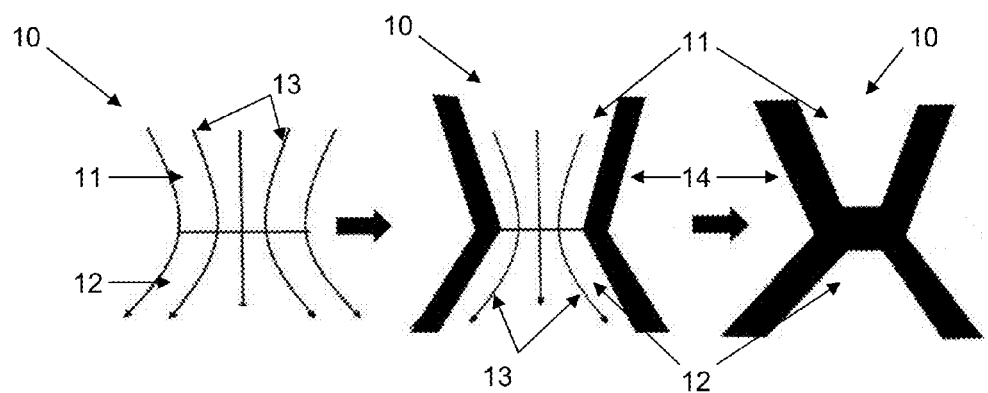
FIG. 2

ELECTRICAL POWER LINE CONNECTOR

The present application claims the benefit of the filing date of Provisional Application for Patent Ser. No. 61/731,563 filed Nov. 30, 2012, which is incorporated herein by reference.

The present disclosure relates to an electrical connector for connecting electrical power transmission lines and an electrical power transmission system including the electrical connector.

Connectors for overhead power transmission lines are critical to the reliability of the power transmission system. The probability of electrical connector failure is much higher than that of other components utilized in an overhead power transmission line. Due to increased power demand and a lack of new power transmission infrastructure, existing overhead power transmission lines often operate at temperatures and power densities far greater than the limits for which they were designed. As the operating temperature increases, the risk of electrical connector failure also increases due to both mechanical and chemical reasons. At increased temperatures, oxidation of electrical connectors may increase, decreasing the effectiveness of mechanical clamps used for applying compressive force to opposing ends of a connector.

Oxides naturally grow on many metallic surfaces. Oxide growth may significantly increase electrical resistance at the electrical conductor/electrical connector interface, which leads to an increase in local temperatures and a decrease in contact strength that is created by crimping of the connectors.

Thus, thin layers of metal oxides can become an effective electron barrier on conducting materials. The inception and growth of oxides significantly reduces the availability of electrical conduction pathways, which results in a significant increase in the local current density within a limited electrical contact area. Enhanced local current density leads to significant temperature increases at the contact interface, further resulting in accelerated aging of connector systems. As an example, pure aluminum has a specific resistance of $2.6 \times 10^{-6}$ $\Omega$-cm, while aluminum oxide ($Al_2O_3$) has a specific resistance greater than $2.5 \times 10^6$ $\Omega$-cm.

One concept of improving the conductivity of the conductor interface is to inhibit oxide formation. Current mitigation methods adopted by the electrical industry include enhancing the contact area by increasing contact pressure with clamps, and using contact aid compounds, which are typically made of petroleum and provide some degree of protection against oxidation. Both methods carry significant drawbacks. When service temperature rapidly increases at the conductor/connector interface, the benefit associated with increased interfacial contact force is largely offset by thermomechanical relaxation at elevated temperatures. Contact aid compounds are typically greasy in nature, evaporate at elevated temperatures, and become less effective over time.

What is desired is a barrier-free metallic conducting interface which is not susceptible to significant increases in local current density, and a method of making the same.

FIGS. 1A and 1B are Scanning Electron Microscope (SEM) micrographs showing the growth of an interfacial gap growth in an electrical connector after 3 years of service.

FIG. 2 is a schematic time lapse diagram representing aluminum metal oxidation and the effect on electrical power transmission.

Figure 3:
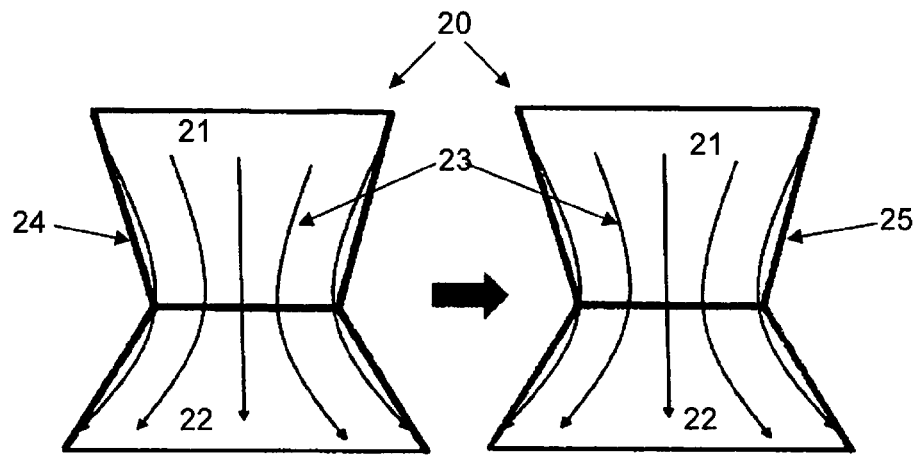
FIG. 3 is a schematic time lapse diagram representing aluminum metal, which has been doped with indium, wherein the indium may oxidize and still allow power transmission.

Provided is a surface doped electrical connector which exhibits reduced base metal oxidation and increased interfacial electrical conductivity. According to certain illustrative embodiments, the doped electrical connector comprises a base metal having a surface, wherein the surface is doped with a conductive material dopant other than the base metal. The electrical connector is capable of conducting about $1 \times 10^6$ to about $2.5 \times 10^6$ siemens per meter squared ($S/m^2$).

Also provided is an electrical power transmission system. In electrical power transmission systems, overhead power lines are connected via electrical connectors. Several power lines may be joined together with the use of an electrical connector. Electrical power transmission systems which comprise pure aluminum electrical connectors are susceptible to oxidation. An electrical power transmission system employing a doped aluminum electrical connector is therefore provided. According to certain illustrative embodiments, the electrical power transmission system comprises at least one power transmission line and an electrical connector comprising a base metal having a surface, wherein the surface is doped with a conductive material dopant other than the base metal.

According to certain embodiments, the base metal of the electrical connector may comprise aluminum, copper, iron, or mixtures thereof. The base metal is an electrical conductor, and provides an electron path for electrical power transmission.

The surface of the base metal is doped with a conductive material dopant that is different from the base metal. The conductive material dopant deposited onto the surface of the base metal may decrease, minimize, or even eliminate oxidation of the base metal of the electrical connector. In certain embodiments the conductive material dopant may comprise indium, tin, nickel, or mixtures thereof. According to certain illustrative embodiments, the conductive material dopant comprises indium.

In certain embodiments, the base metal is doped with a sufficient amount of conductive material dopant to minimize or substantially eliminate oxidation of the base metal. In certain embodiments, the conductive material dopant is applied to the surface as a substantially uniform layer. In certain embodiments, the surface is doped to a depth of about 50 nanometers (nm) to about 200 nm. The surface may comprise a part of the base metal, but which has been doped with a conductive material dopant.

Techniques such as electron beam evaporation, thermal evaporation, sputtering, and electroplating are non-inclusive examples of methods to create a doped surface on the base metal. Base metal materials such as aluminum, copper, iron, or mixtures thereof may be doped with conductive material dopants such as indium, tin, nickel, or mixtures thereof. Indium, tin, nickel, and mixtures of these are desirable because of their ability to form conductive oxides in situ during normal operation of the power transmission system.

Tuning the surface properties of conductor materials may reduce the oxidation tendency or decrease the electrical resistivity of oxide layers. Doping techniques which modify the surface of conductor materials may reduce oxidation and increase the interfacial conductivity of conductor materials. By doping the base metal with a conductive material dopant, improved electrical connector system performance, improved electrical connector system durability, and fewer power outages may result.

In certain embodiments, the doped surface is capable of forming an oxide while remaining electrically conductive. During normal operation, the doped surface forms a conductive oxide, such as $In_2O_3$, and provides an alternative electron path for power transmission in addition to the base metal. The conductive oxide then may provide protection against corrosion and oxidation of the base metal.

In certain embodiments, contact resistance of the doped electrical connector may increase by less than 50% after undergoing thermal cycling from ambient temperature to about 150° C. for up to 300 cycles.

Also provided is a method comprising joining power transmission lines with an electrical connector as described above, comprising a base metal having a surface that is doped with an electrically conductive material dopant that is different from the base metal. The electrical connector is capable of conducting about $1 \times 10^6$ to about $2.5 \times 10^6$ siemens per meter squared ($S/m^2$).

In joining the power transmission lines with the electrical connector, the base metal may be mechanically and/or chemically cleaned. The cleaned base metal is introduced into a suitable chamber for applying the electrically conductive material dopant. Without limitation, suitable chambers may include vacuum chambers or liquid vessels. The base metal of the electrical connector is contacted or exposed to the electrically conductive material dopant within the chamber. The conductive material dopant may be evaporated or deposited onto the base metal surface, forming the doped surface or a uniform surface layer.

Electron beam evaporation, thermal evaporation, sputtering, and electroplating are non-inclusive examples of methods used to dope a base metal. In each process, a suitable processing vessel is provided, such as a vacuum chamber or liquid container. A base metal sample is then inserted into the processing vessel. The processing vessel may utilize an evaporator or evaporation mechanism, which may provide conductive material dopant. In certain processes, the conductive material dopant is excited by the evaporator and migrates to the base metal. At the base metal, the conductive material dopant forms a doped surface and/or uniform surface layer.

The doped surface protects the base metal from further exposure to corrosion and oxidation. During service, the conductive material dopant of the doped surface or surface layer will form a conductive oxide, which protects the base metal from oxidation and corrosion, and also provides an alternative electron path for power transmission. In certain embodiments, an aluminum base metal doped with the conductive material dopant indium, will form indium oxide at the surface rather than aluminum oxide.

The conductive material dopant of the electrical connector joined with the power transmission line is electrically conductive when subjected to an electrical current. As the electrical current is applied to the electrical connector, the conductive material dopant will eventually oxidize. The oxidized conductive material dopant may conduct electrical current even in an oxidized state.

During normal operating conditions, the electrical connector may experience operating temperature fluctuations due to varying electrical demand. In certain embodiments, the electrical connector joined with the power transmission line is capable of being cycled between about 0° C. and about 150° C. Electrical connectors are used for overhead lines at all voltages and currents.

FIGS. 1A and 1B shows an SEM micrograph of the growth of an interfacial gap between base metal components. Micrograph 1A shows the interface between base metal components, an aluminum wire and an aluminum splice, in an as fabricated, compressed electrical connector. Micrograph 1B shows an interfacial gap of the electrical connector after about 3 years of service. Comparing the two micrographs, the gap between base metal component parts has widened and grown after about three years of service, indicating that the connector material has degraded.

FIG. 2 shows a schematic prior art electrical connector under a time lapse progression. The connector 10 comprises a first aluminum base metal 11 and a second aluminum base metal 12. Electrical current 13 as shown by arrows flows from first aluminum base metal 11 to second aluminum base metal 12. As the connector 10 experiences normal operation over time, the surfaces of first aluminum base metal 11 and second aluminum base metal 12 become oxidized and form an aluminum oxide ($Al_2O_3$) coating 14. The aluminum oxide coating 14 is more electrically resistive to electrical current 13 than the base aluminum. As more time passes, the aluminum oxide coating 14 thickens and may drastically reduce or interrupt the flow of electrical current 13.

Now referring to FIG. 3, a schematic illustrative embodiment of the present electrical connector is shown. The connector 20 comprises a first aluminum base metal 21 in contact with a second aluminum base metal 22. Each of the first aluminum base metal 21 and second aluminum base metal 22 have been doped with indium conductive material dopant 24. As connector 20 experiences normal operation, electrical current 23 flows through connector 20. As electrical current 23 flows, the indium conductive material dopant 24 oxidizes to form indium oxide ($In_2O_3$) 25. Indium oxide 25 also conducts electricity, allowing electrical current 23 to flow without interruption, and prevents oxidation of the aluminum base metal.

Figure 4:
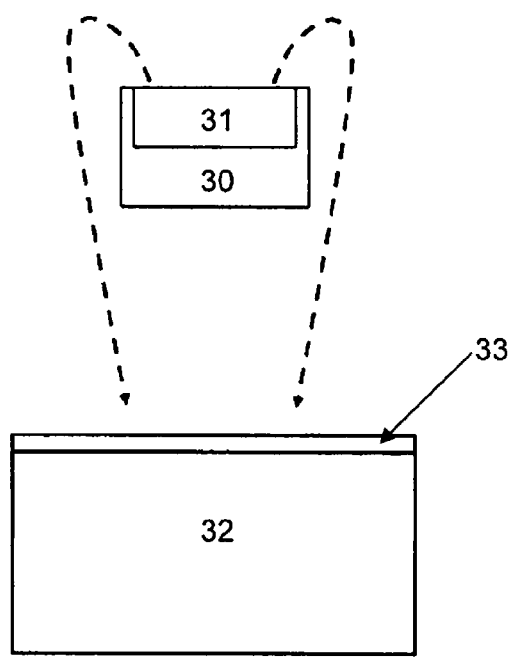
FIG. 4 is a schematic diagram representing an illustrative method for doping a metal with a dopant.

One illustrative dopant deposition process for applying the electrically conductive material dopant onto the surface of the base metal is shown in FIG. 4. An appropriate vacuum chamber or liquid vessel is provided. Base metal 32 is introduced into the vacuum chamber or liquid vessel. Conductive dopant material 31 is introduced into an evaporator 30 within the chamber or vessel. The evaporator 30 excites the conductive dopant material 31. The excited conductive dopant material 31 migrates to base metal 32, and creates a doped surface 33.

Testing was performed on several indium doped aluminum samples. An 1100 aluminum alloy was cut into 10×10×5 mm³ samples. The samples were polished, and then introduced into a vacuum chamber. Inside the chamber, the samples were subjected to 1800 psi hydrogen gas for 72 hours. After hydrogen treatment, the samples were doped with indium via electron beam evaporation. In the first batch of samples, only half of the surface of the aluminum was doped with indium, leaving some aluminum surface exposed. The indium dopant was doped to a depth of 15 nm on the aluminum base metal. In the second set of samples, substantially the entire surface was doped with indium. The second samples were doped to a depth of 200 nm.

Figure 7:
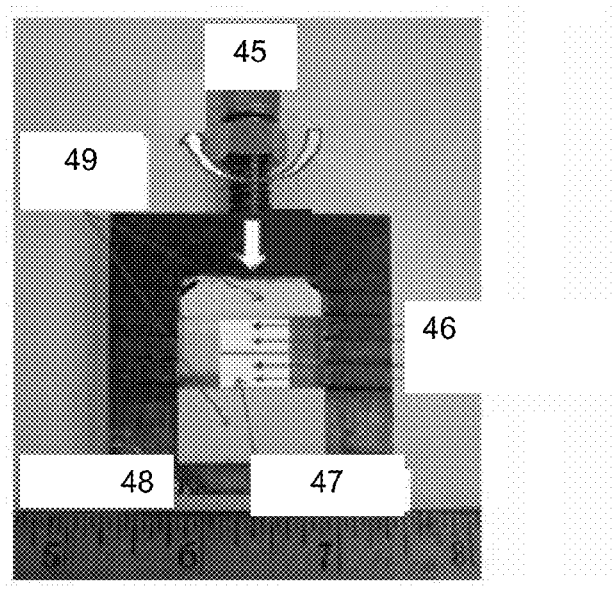
FIG. 7 is a diagram depicting a setup for testing doped samples.

Referring to FIG. 7, a diagram depicting the setup for testing doped samples is shown. Steel frame 48 is engaged with a screw 45 to exert pressure on a testing assembly for measuring contact resistivity in sample metal 47. Sample metal 47 comprises a base metal which may or may not be doped with conductive material dopant. Screw 45 directly applies pressure to zirconia insulators 49, which apply pressure to sample metal 47. Voltage and electrical current are measured from leads within the sample assembly 46.

To simulate the compressive force applied to connectors, a clamp fixture was designed and fabricated. Samples 47 were clamped against each other using the steel frame 48, while the conductance across the sample interface was measured. Mechanical pressure to push the samples together was applied via screw 45. Additionally, two zirconia insulators 49 were used between the samples 47 and the steel frame 48 to provide electrical and thermal insulation.

Figure 8:
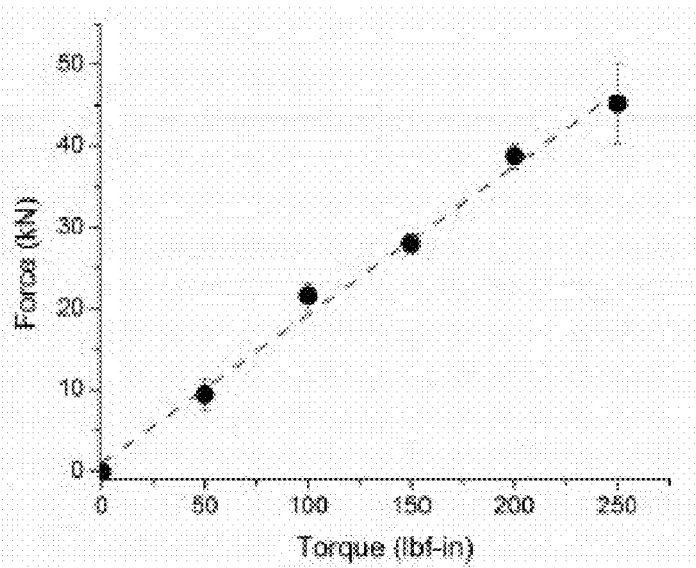
FIG. 8 is a scatter plot showing the relationship between torque and force applied to electrical connector material samples.

Referring to FIG. 8, a scatter plot depicts the relationship between torque and force applied to the testing samples. As torque is applied to the screw of the steel frame, the force applied to the test sample increases proportionally. The relationship between the torque on the screw and the force applied to the samples was determined from calibration samples with strain gauges attached. As seen in FIG. 8, the force versus torque relationship showed a good linear trend in the force range for studying the samples. For all samples, the initial nominal contact pressure was fixed at 56 MPa.

Contact resistance across aluminum surfaces is typically small, therefore a four probe method, ASTM B539, was used to eliminate the contribution of wire resistance to the total resistance. Two pieces of copper sheets were used as current leads, and voltage leads were attached to the test samples using ultrasonic soldering with an indium solder.

Figure 9:
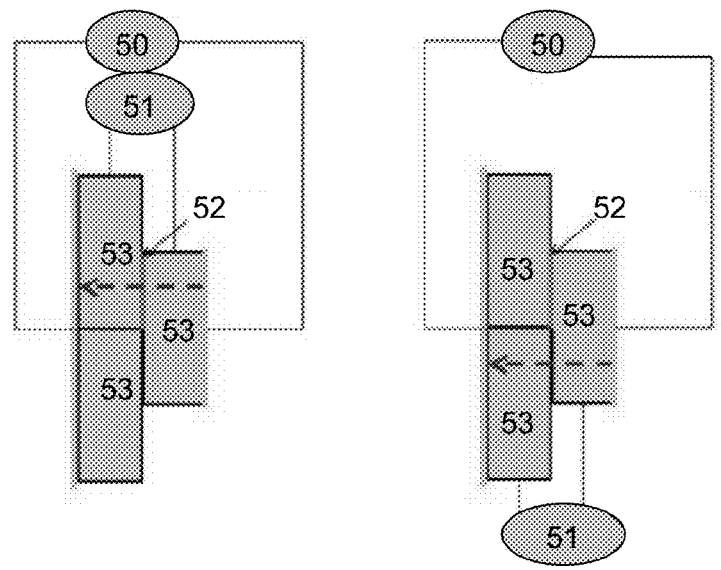
FIG. 9 is a schematic diagram depicting a sample testing setup for partially coated samples.

The test setup for the one-half indium doped aluminum samples is shown in FIG. 9. Electrical current was supplied from a source 50. Electrical voltage was also supplied from a source 51, attached to several different leads on the test samples. The voltage source leads were changed so as to measure contact resistivity across both the aluminum/indium/aluminum interface indicated by indium layer 52, and between different aluminum samples 53.

The half surface doped test samples were clamped against two undoped samples such that one of the undoped samples was in contact with the indium doped portion of the test sample, while the other undoped sample was in contact with the undoped portion of the test sample. The samples setup is exemplified by FIG. 9. With this setup, two different interfaces were formed, 1) an aluminum/aluminum interface to be used as a baseline, and 2) an aluminum/indium/aluminum interface to monitor the effectiveness of the indium dopant. Voltage between the doped interface and the undoped interface was measured in two separate steps to determine the contact resistance of the different interfaces. The alternating voltage application is shown by FIG. 9, as the voltage leads were attached to different areas on the test samples.

Figure 10:
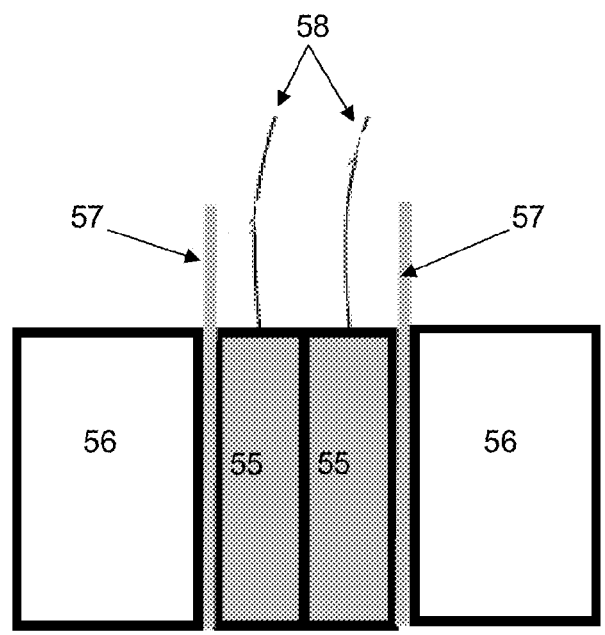
FIG. 10 is a schematic diagram depicting a sample testing setup for fully coated samples.

Referring to FIG. 10, the test setup for fully doped aluminum samples is shown. Indium doped aluminum samples 55 were arranged between copper current leads 57. The copper current leads 57 were pushed against the indium doped aluminum samples 55 by zirconia insulating material 56. Voltage was then applied to the indium doped aluminum samples by voltage leads 58.

The fully doped samples utilized a different testing setup than the half surface doped samples. As seen in FIG. 10, each of the samples with the entire surface having been doped was clamped against one (1) uncoated aluminum sample to form the aluminum/indium/aluminum interface. In addition, two undoped aluminum samples were also prepared in a similar fashion to provide baseline data for an aluminum/aluminum interface.

Figure 11:
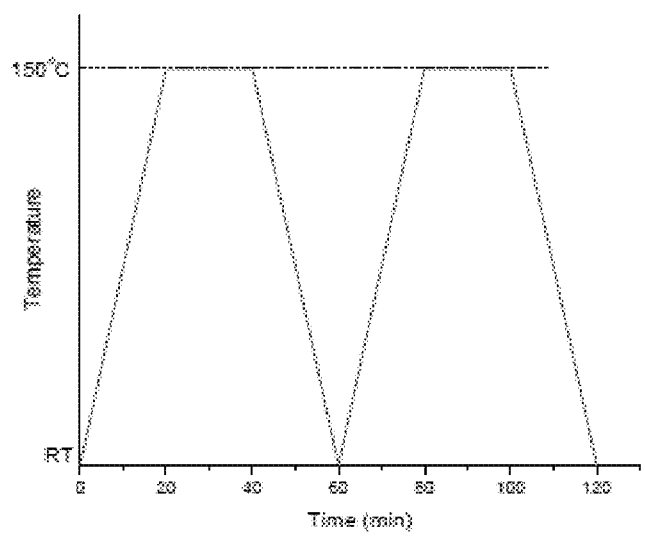
FIG. 11 is a graphical representation of time-temperature cycling used to simulate thermal cycling during normal use of an electrical connector.

Now referring to FIG. 11, the time and temperature profile for thermal cycling the testing samples is shown. To simulate thermal cycling of the connector systems during service, the test sample assembly was placed inside a resistance heating furnace and cycled between room temperature and 150° C., over sixty (60) minutes. During the sixty minute cycle, temperature was increased from room temperature up to 150° C. over the first twenty minutes. The temperature of the sample was maintained at 150° C. for the next twenty minutes. Finally, the temperature was lowered from 150° C. to room temperature over the last twenty minutes. A thermal cycle comprises heating a test sample from room temperature to 150° C., and cooling it down to room temperature in a period of sixty minutes.

One-hour cycles were used to obtain expedited testing results. The contact resistance of all samples was initially measured prior to thermal cycling. After fifty (50) thermal cycles were run, the samples were removed from the furnace, and the contact resistance was measured again.

Figure 12:
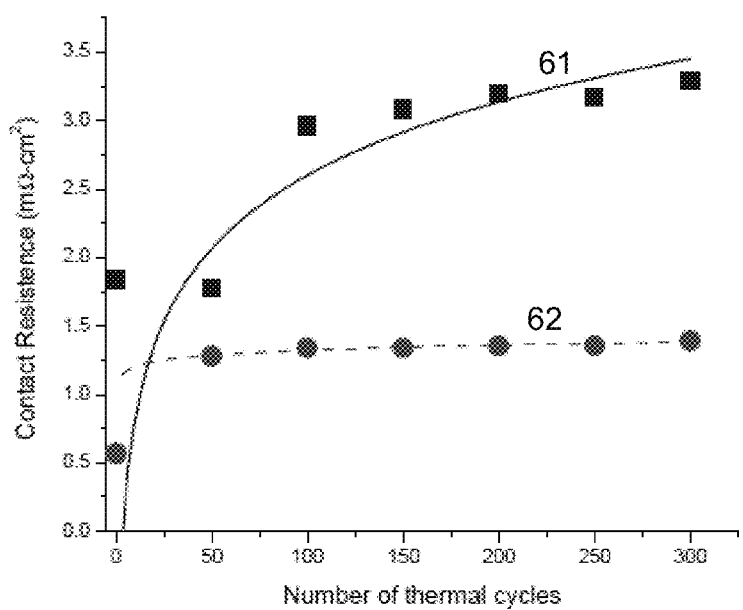
FIG. 12 is a scatter plot depicting sample data for contact resistance versus number of thermal cycles run on an electrical connector material sample.

The half surface doped samples were cycled between room temperature and 150° C. using the temperature profile shown in FIG. 11 for a total number of 300 cycles. The contact resistances across the aluminum/aluminum interface and aluminum/indium/aluminum interface both increased with increased thermal cycling numbers. Now referring to FIG. 12, the relationship between contact resistance and number of thermal cycles run is depicted for a half surface doped sample. FIG. 12 shows the contact resistance plotted versus number of thermal cycles. The contact resistance of the aluminum/aluminum interface is represented by data series 61. The contact resistance of the aluminum/indium/aluminum interface is represented by data series 62. The aluminum/aluminum interface data series 61 exhibits a contact resistance of 1.8 mΩ-cm² before any thermal cycling, and then increases to 3.3 mΩ-cm² after 300 thermal cycles. The aluminum/indium/aluminum interface data series 62 exhibits a contact resistance of 0.6 mΩ-cm² initially, and then increases to 1.3 mΩ-cm² after 300 thermal cycles. The results indicated that the introduction of indium on an aluminum surface might lower contact resistance as well as retarding material degradation.

Figure 13:
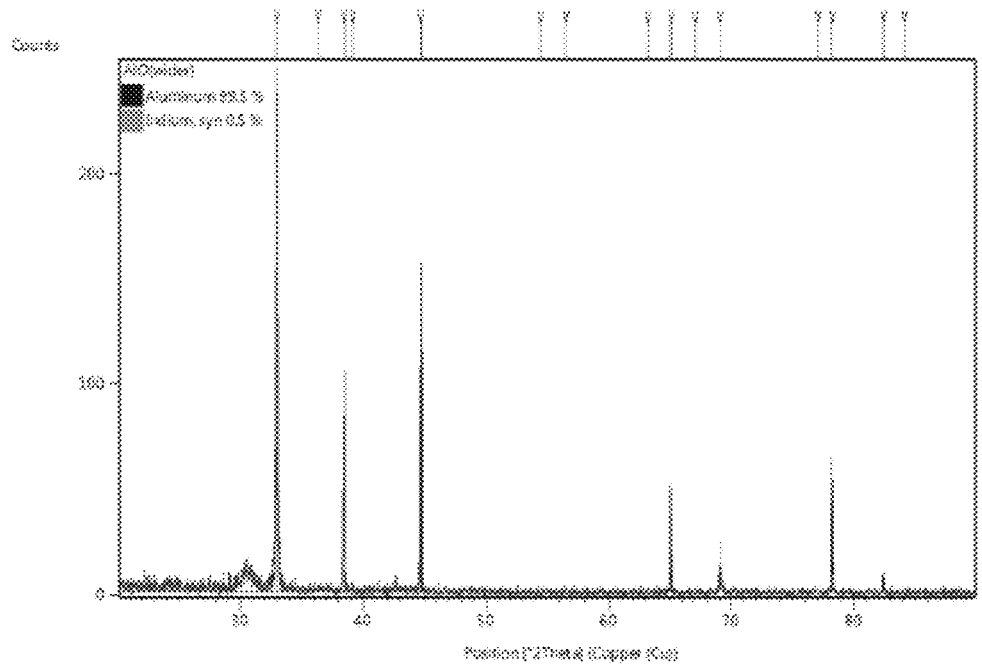
FIG. 13 is an x-ray diffraction analysis graph exhibiting the impact of indium as a dopant on an aluminum base metal at an aluminum/indium/aluminum interface.

Referring to FIG. 13, x-ray diffraction (XRD) was performed on the half surface doped sample after 300 cycles, and the XRD results are shown. The indium doped half surface showed characteristic peaks of aluminum and indium. In addition, a small peak around 30° was also observed, which is believed to be indium oxide.

Figure 14:
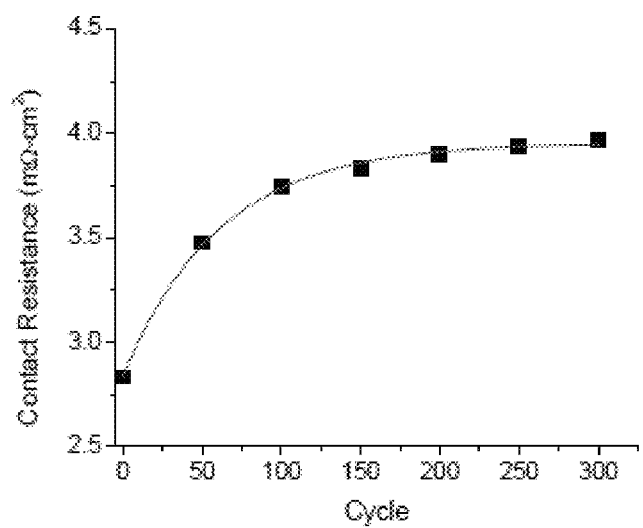
FIG. 14 is a scatter plot showing the relationship between contact resistance versus number of thermal cycles in a fully coated indium doped aluminum sample.

The relationship between contact resistance and number of thermal cycles run is depicted for a fully doped sample in FIG. 14. The fully doped samples were cycled between room temperature and 150° C. using the temperature profile shown in FIG. 11 for a total number of 300 cycles. The aluminum/indium/aluminum interface exhibited a contact resistance of 2.8 mΩ-cm$^2$ initially. After 300 cycles, the contact resistance increased to 3.9 mΩ-cm$^2$, an increase of only about 39%.

Figure 15:
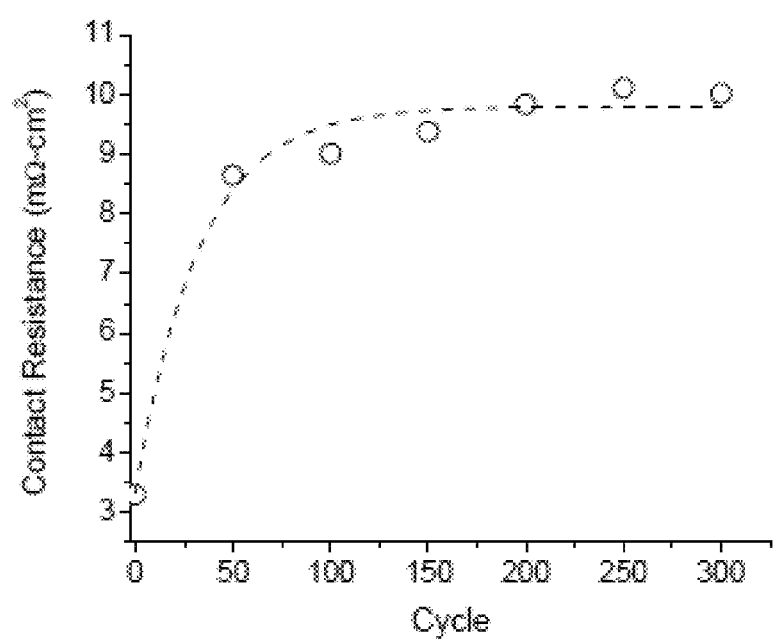
FIG. 15 is a scatter plot showing the relationship between contact resistance versus number of thermal cycles in a pure aluminum sample.

The relationship between contact resistance and number of thermal cycles run is depicted for an undoped sample in FIG. 15. The undoped samples were cycled between room temperature and 150° C. using the temperature profile shown in FIG. 11 for a total number of 300 cycles. The aluminum/aluminum interface exhibited a contact resistance of 3.3 mΩ-cm$^2$ initially. After 300 cycles, the contact resistance increased to 10 mΩ-cm$^2$, 300% of the original value.

The initial contact resistance of the aluminum/indium/aluminum interface (2.8 mΩ-cm$^2$) was about 15% lower than that of the aluminum/aluminum interface (3.3 mΩ-cm$^2$). In the half surface doped sample, the initial contact resistance of the aluminum/indium/aluminum interface (0.6 mΩ-cm$^2$) was about 53% lower than that of the aluminum/aluminum interface (1.3 mΩ-cm$^2$). Without being bound by any particular theory, this discrepancy may have been a result of the inaccurate shape of the indium doping on the half surface doped sample. Based on these results, the indium doping may be shown to reduce the initial contact resistance.

Figure 5:
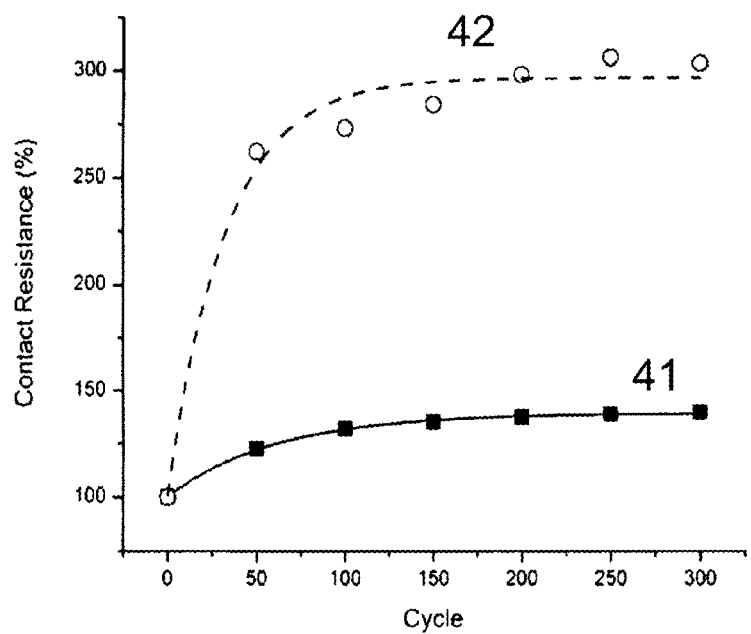
FIG. 5 is a scatter plot chart showing an indium doped aluminum base metal/indium doped aluminum base metal interface exhibiting lower contact resistance than a pure aluminum/aluminum interface.

A scatter plot graph of contact resistance is shown in FIG. 5. Data series 41 represents the contact resistance of an indium/aluminum interface from 0 to 300 cycles of use. Data series 42 represents the contact resistance of an aluminum/aluminum interface from 0 to 300 cycles of use. Before any cycling is performed, the contact resistance of both the indium/aluminum interface and the aluminum/aluminum interface are the roughly the same. After only 50 use cycles are completed, the aluminum/aluminum interface exhibits a contact resistance rise to over 250% of its original value. By comparison, after 50 use cycles, the indium/aluminum interface has risen to 125% of its original value. After 300 cycles, the aluminum/aluminum interface contact resistance has risen to over 300% of its original value compared to only about 139% for the indium/aluminum interface. The introduction of indium on the aluminum surface lowered the contact resistance of the doped sample interface.

The indium doping significantly reduced the interfacial conductivity degradation. When normalized to the respective initial values, the growth rate of contact resistance for the indium doped sample was much lower than that of the bare aluminum/aluminum interface, as shown in FIG. 5. Over the 300 cycle period, the aluminum/aluminum interface experienced contact resistance of almost 300% of the original value, whereas the aluminum/indium/aluminum interface had only a 39% increase. The contact resistance growth rate of the indium doped samples was at least one order of magnitude lower than the contact resistance growth rate of the undoped aluminum samples. These results indicate the effectiveness of indium in enhancing the interfacial conductance of aluminum materials subject to thermal cycling.

Figure 6:
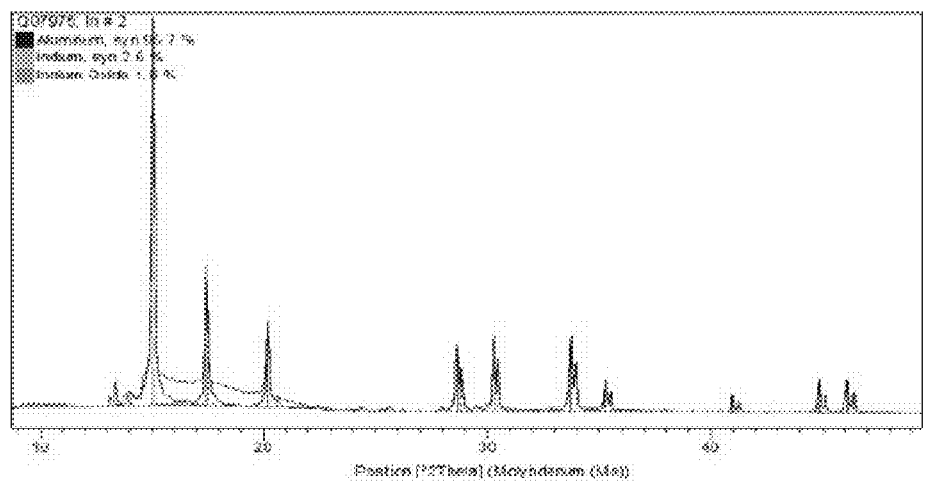
FIG. 6 is an x-ray diffraction analysis graph exhibiting the formation of indium oxide on an electrical connector.

Now referring to FIG. 6, x-ray diffraction data analysis of an aluminum base metal doped with indium is shown. The present electrical connector was subjected to 300 thermal cycles, and was analyzed. Each thermal cycle included heating the test samples from room temperature to 150° C., and then cooling the sample back to room temperature over sixty minutes. The x-ray diffraction analysis shows the presence of three (3) different materials in an electrical connector after normal operation. The indium doped surface showed characteristic peaks of aluminum, indium, and indium oxide. The first set of three (3) peaks indicates the presence of the aluminum base metal. The second set of four (4) peaks indicates the presence of indium. The last set of three (3) peaks indicates the presence of indium oxide.

The formation of the indium oxide indicates that the indium dopant served as a sacrificial agent to protect the aluminum base metal from oxidation, and also retarded material degradation. The formation of the indium oxide may contribute to the improved interfacial conductance by preventing the formation of aluminum oxide as well.

In a first embodiment of the present subject matter, the doped electrical connector comprises a base metal having a surface, wherein the surface is doped with a conductive material dopant other than the base metal. The electrical connector is capable of conducting about $1 \times 10^6$ to about $2.5 \times 10^6$ siemens per meter squared (S/m$^2$).

The base metal of the electrical connector of the first embodiment may comprise aluminum, copper, iron, or mixtures thereof.

In the electrical connector of any of the first or subsequent embodiments, the conductive material dopant may comprise indium, tin, nickel, or mixtures thereof. The conductive material dopant may be applied to the surface as a substantially uniform layer. The surface may be doped to a depth of about 15 nanometers (nm) to about 200 nm.

In the electrical connector of any of the first or subsequent embodiments, the doped surface is capable of forming an oxide while remaining electrically conductive.

In the electrical connector of any of the first or subsequent embodiments, the contact resistance of the connector increases by less than 50% after undergoing thermal cycling from ambient temperature to about 150° C. for up to 300 cycles.

In a second embodiment of the present subject matter, a method is provided comprising joining power transmission lines with an electrical connector as defined in any one of the first and subsequent embodiments.

In a third embodiment of the present subject matter, an electrical power transmission system comprises at least one power transmission line and an electrical connector comprising a base metal having a surface, wherein the surface is doped with a conductive material dopant other than the base metal.

In a fourth embodiment of the present subject matter, an electrical power transmission system comprises at least one power transmission line and an electrical connector as defined in any of the first or subsequent embodiments.

Although the electrical connector, power transmission system, and method of joining power transmission lines with an electrical connector have been described in detail through the above detailed description and the preceding examples, these examples are for the purpose of illustration only and it is understood that variations and modifications can be made by one skilled in the art without departing from the spirit and the scope of the disclosure. It should be understood that the embodiments described above are not only in the alternative, but can be combined.

We claim:

1. An electrical power line connector capable of conducting about $1 \times 10^6$ to about $2.5 \times 10^6$ siemens per meter squared (S/m$^2$) comprising a base metal having a surface, wherein the surface is doped with a conductive material dopant other than the base metal, and wherein contact resistance of the connector increases by less than 50% after undergoing thermal cycling from ambient temperature to about 150° C. for up to 300 cycles.

2. The electrical power line connector of claim 1, wherein the base metal comprises aluminum, copper, iron, or mixtures thereof.

3. The electrical power line connector of claim 1, wherein the base metal comprises aluminum.

4. The electrical power line connector of claim 1, wherein the conductive material dopant comprises indium, tin, nickel, or mixtures thereof.

5. The electrical power line connector of claim 1, wherein the conductive material dopant is indium.

6. The electrical power line connector of claim 3, wherein the conductive material dopant is indium.

7. The electrical power line connector of claim 1, wherein the doped surface forms an oxide while remaining electrically conductive.

8. The electrical power line connector of claim 7, wherein the surface is doped to a depth of about 15 nanometers (nm) to about 200 nanometers (nm).

9. The electrical power line connector of claim 1, wherein the conductive material dopant comprises a substantially uniform layer at the surface of said base metal.

10. An electrical power line connector capable of conducting about $1 \times 10^6$ to about $2.5 \times 10^6$ siemens per meter squared ($S/m^2$) comprising a base metal having a surface, wherein the surface is doped with a conductive material dopant other than the base metal, and wherein the conductive material dopant is indium.

11. A method comprising joining power transmission lines with an electrical power line connector as defined in claim 1.

12. An electrical power transmission system comprising at least one power transmission line and an electrical power line connector as defined in claim 10.

13. An electrical power transmission system comprising at least one power transmission line and an electrical power line connector as defined in claim 1.

14. An electrical power line connector capable of conducting about $1 \times 10^6$ to about $2.5 \times 10^6$ siemens per meter squared ($S/m^2$) comprising a base metal having a surface, wherein the surface is doped with a conductive material dopant other than the base metal, and wherein the doped surface forms an oxide while remaining electrically conductive.

15. The electrical power line connector of claim 14, wherein the surface is doped to a depth of about 15 nanometers (nm) to about 200 nanometers (nm).

16. The electrical power line connector of claim 14, wherein the base metal comprises aluminum, copper, iron, or mixtures thereof.

17. The electrical power line connector of claim 14, wherein the conductive material dopant comprises indium, tin, nickel, or mixtures thereof.

18. An electrical power transmission system comprising at least one power transmission line and an electrical power line connector as defined in claim 14.

19. The electrical power line connector of claim 10, wherein the base metal comprises aluminum.

20. The electrical power line connector of claim 10, wherein the base metal comprises aluminum, copper, iron, or mixtures thereof.

* * * * *